United States Patent [19]
Nishiguchi et al.

[11] Patent Number: 4,743,923
[45] Date of Patent: May 10, 1988

[54] THERMAL HEAD

[75] Inventors: Yasuo Nishiguchi; Tsuyoshi Yasutomi, both of Kokubu; Ryoichi Shiraishi, Kagoshima; Akira Sasaki; Yoshihito Takahashi, both of Hitachi; Katsumasa Mikami, Naka; Masafumi Suzaki; Akiyoshi Hakoyama, both of Hitachi, all of Japan

[73] Assignees: Kyocera Corporation, Kyoto; Hitachi, Ltd., Tokyo, both of Japan

[21] Appl. No.: 941,644

[22] Filed: Dec. 15, 1986

[30] Foreign Application Priority Data

Dec. 20, 1985 [JP] Japan ................................ 60-285549
May 9, 1986 [JP] Japan ................................ 61-104606

[51] Int. Cl.⁴ .......................................... G01D 15/10
[52] U.S. Cl. ............................. 346/76 PH; 219/216; 400/120
[58] Field of Search ............... 346/76 PH, 139 C; 400/120; 219/543, 216 PH; 338/307, 308

[56] References Cited
U.S. PATENT DOCUMENTS 4,203,025 5/1980 Nakatani et al. ............. 219/216 PH

FOREIGN PATENT DOCUMENTS 0082283 7/1981 Japan .................................. 400/120

Primary Examiner—Philip H. Leung
Assistant Examiner—Morris Ginsburg
Attorney, Agent, or Firm—Antonelli, Terry & Wands

[57] ABSTRACT

A thin film type thermal head includes a head substrate member, a partial projected glaze portion mounted on the head substrate member, a plurality of heating resistor elements provided on the partial projected glaze portion with each of the heating resistor elements having a uniform thin thickness and two electrode end portions. A common electrode is provided on the partial projected glaze portion and an individual control electrode is also provided on the partial projected glaze portion. The partial projected glaze portion has at least two projected portions of different height with the plurality of heating resistor elements having a portion thereof disposed on at least the highest projected portion of the partial projected glaze portion with both electrode end portions of each of the heating resistor elements being disposed on the partial projected glaze portion other than the highest projected portion of the partial projected glaze portion so as to enable a recording dot to become narrow in the printing direction.

7 Claims, 6 Drawing Sheets

THERMAL HEAD

BACKGROUND OF THE INVENTION

1. Field of the Invention

The present invention relates to a thermal head, and more particularly to a thermal head for a thermal transfer printer or a thermal printer with the improvement of printing quality of a printed product obtained thereby.

The thermal head for utilizing the thermal transfer printer or the thermal printer of the present invention is single thermal head having a partial projected glaze portion mounted on a head substrate member or a thermal head having a plurality of partial projected glaze portions mounted on a head substrate member, such as a dual type thermal head, a zigzag or staggered type thermal head etc..

2. Description of the Prior Art

The conventional thermal head for the thermal transfer printer is disclosed in, for example, Japanese Patent Laid-Open Publication No. 59093/1983, in which the thermal head has partial projected glaze portions having a semi-column cross-sectional shape form so as to form a plurality of heating element rows thereon.

Figure 6:
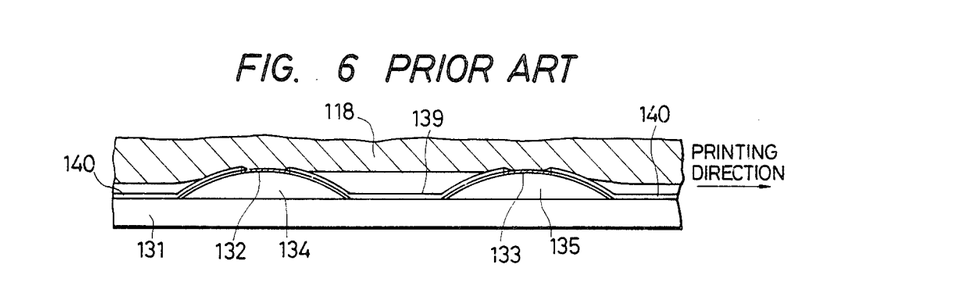
FIGS. 6 and 7 are cross-sectional views between the surrounding portion of the partial projected glaze portion of the thermal head and the platen according to the prior art, respectively.

FIG. 6 shows a sectional view of a conventional thermal head having two heating resistor element rows 132 and 133, in which the thermal head is pressed with a platen 118. The thermal head comprises a head substrate member 131, semi-column cross-sectionally shaped two partial projected glaze portions 134 and 135 mounted on the head substrate member 131, and two heating resistor element rows 132 and 133 formed on the upper sides of the partial projected glaze portions 134 and 135, respectively.

For the simplification of explanation, protective films of the heating resistor element rows 132 and 133, the ink ribbon in which the protective films of the heating resistor element rows 132 and 133 lie between the heating resistor element rows 132 and 133 and the platen 118, and the recording paper are omitted from in FIG. 6.

As shown FIG. 6, there is no problem when a center between the partial projected glaze portions 134 and 135 and a center between the heating resistor element rows 132 and 133 have no offset value or has a small offset value therebetween.

Figure 7:
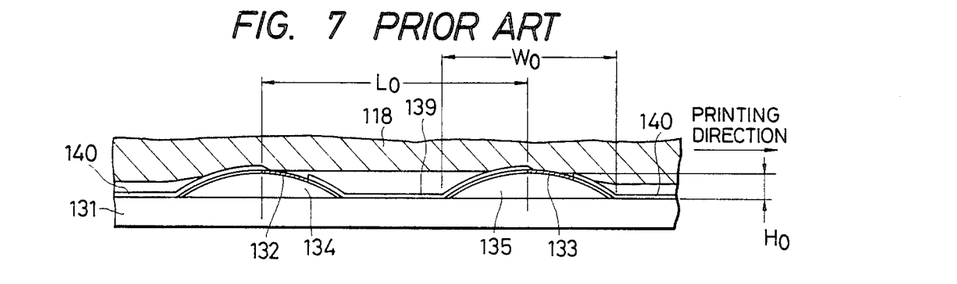

However, because of the manufacturing dispersion of the thermal head, as shown in FIG. 7, the center between the partial projected glaze portions 134 and 135 and the center between the heating resistor element rows 132 and 133 has a comparative large offset value therebetween. The interval ($L_0$) shows distance between the adjacent partial projected glaze portions 134 and 135 and is about 2–4 mm in length. The width ($W_0$) shows width of the partial projected glaze portion 134 or 135 and is about 0.8–1 mm in length. The height ($H_0$) shows height of the partial projected portion 134 or 135 and is about 30–60 $\mu$m in height.

When the heating resistor element rows 132 and 133 has the comparative large offset value respectively toward the printing direction, non-contact area portion or a low contact pressure area portion with the recording paper is created between the heating resistor element row 132 or 133 and the platen 118.

In FIG. 7, the recording paper is omitted, however the above inconvenience or tendency is developed even though under the consideration of the affect of the recording paper. As a result, the transfer or recording dot shape becomes worse, and there is an inconvenience that the unbalance phenomenon occurs in the result of printing product because of the difference of the contact conditions of the heating resistor element rows 134 and 135 with the recording paper.

In the conventional thermal head, the surface of the heating resistor element row is projected roundly all over in a line with the semi-column cross-sectionally shaped partial projected glaze portion and the contact area pressure portion of the heating resistor element row with the recording paper is designed uniformly at the printing time.

Therefore, the transfer or recording dot shape may reproduce almost the heating resistor element shape. However, generally the transfer or recording dot shape is lengthened toward the movement direction or the electrode direction of the thermal head in comparison with the heating resistor element shape when the thermal head runs continuously. The more the transfer or recording dot shape lengthens toward the movement direction or the electrode direction of the thermal head, the more the recording speed of the thermal head is increased, as a result the the printing product quality by the thermal head becomes poor.

Figure 14:
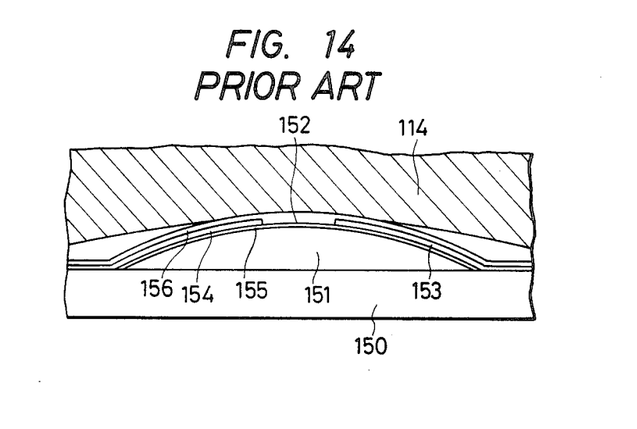
FIG. 14 is a cross-sectional view surrounding the heating resistor element of the thermal head according to the prior art.

FIG. 14 shows a sectional view of the thermal head under the printing time, in which the conventional partial projected glaze portion structure is used. The ink ribbon is omitted therefrom. A resistor film 155, a common electrode 153, an individual control electrode 164, and a protective film 156 are coated on a partial projected glaze portion 151 in order. The partial projected glaze portion 151 is disposed on a head substrate member 150.

As shown this figure, a heating resistor element 152 contacts all over with recording a paper 114. When the thermal head does not move, only one dot is transferred on the recording paper 114, the recording dot having a similar dimension that of the heating resistor element 152 would be obtained. However, generally the thermal head prints under the condition that the thermal head moves.

Figure 15:
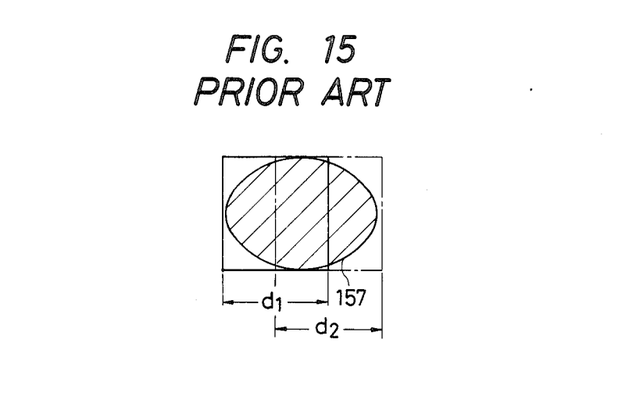
FIG. 15 is a printing recording dot formed by the thermal head according to the prior art.

By the electric current time of the heating resistor element 152 and the heat transmission time of the protective film 156 and the ink ribbon, the recording or transfer dot 157 is lengthened toward the thermal head movement direction in proportion to the movement amount of the heating resistor element 15. (see FIG. 15). The length $d_1$ shows the starting condition of the heating resistor element 152 and the length $d_2$ shows the condition of the heating resistor element 152 when one dot is continued.

In the conventional thermal transfer printer, as stated above, the thermal transfer printer having the high speed and the high printing product quality is not taken into consideration.

For the sake of the miniaturization and the low price of the integral circuit (IC) apparatus for driving the thermal head and also the restraint of electric current loss of the heating resistor element driving electric power etc., it is necessary to carry out under high voltage and low electric current driving, in which the resistance value of the heating resistor element is increased. The resistance value of the heating resistor element depends on the kind of material, dimension or film thickness of the heating resistor element itself.

The correction of the lengthening of the recording dot through the dimension of the heating resistor element can be done by shortening of the distance between the common electrode end portion and the individual control electrode end portion of the heating resistor element, because of both of the common electrode end portion of the heating resistor element and the individual control electrode end portion of the heating resistor element are drawn toward the lateral direction or the printing direction. However, when the lateral or side dimension of the heating resistor element shortens, the resistance value of the heating resistor element becomes low.

As a result, the electric current amount under the electric current increases and the electric current capacity of the IC apparatus for driving the thermal head becomes large, an exothermic or heating resistor amount of the thermal head concentrates in the heating resistor element having a short lateral dimension or a short printing direction dimension, and the life of the heating resistor element is reduced.

By making the film thickness of the heating resistor element of the thermal head thinner, the resistance value of the heating resistor element may be increased. However, the exothermic or heating resistor amount of the thermal head concentrates at the thinner film thickness portion, as a result the life of the heating resistor element of the thermal head is reduced.

SUMMARY OF THE INVENTION

An object of the present invention is to provide a thermal head wherein the high printing quality can be obtained.

Another object of the present invention is to provide a thermal head wherein the printing density unbalance can be improved widely.

A further object of the present invention is to provide a thermal head wherein the contact area portion between the partial projected glaze portion and the recording paper can be made uniform.

Still another object of the present invention is to provide a thermal head wherein the contact pressure area value between the partial projected glaze portion and the recording paper can be made larger.

A further object of the present invention is to provide a thermal head wherein the resistance value of the heating resistor element can be higher and the life of the heating resistor element can be made longer.

Still another object of the present invention is to provide a thermal head wherein the lengthening of the recording dot can be corrected.

A thermal head has a head substrate member, a partial projected glaze portion mounted on the head substrate member and a plurality of heating resistor elements formed on the partial projected glaze portion. The partial projected glaze portion is formed by at least two projected portions and the plurality of heating resistor elements are disposed on at least the highest projected portion of the partial projected glaze portion. The partial projected glaze portion comprises at least two projected partial projected glaze portions, in particular, comprises two projected partial projected glaze portions which are a lower projected partial projected glaze portion at a lower side and a locally upper projected partial projected glaze portion at an upper side. The locally projected partial projected glaze portion has a substantially trapezoidally cross-sectional shape form.

In the thermal head having a plurality of partial projected glaze portions in which a plurality of heating resistor element rows are disposed thereon, for the differences of the contact conditions between each of the partial projected glaze portions of the preceding heating resistor element and of the subsequent heating resistor element in the printing direction and the recording paper are nonuniform and cause differences of the printing density.

To settle the above inconvenience, the partial projected glaze portion is formed with projected portions having a plurality of stages and the heating resistor element is disposed at least at the uppermost stage of the projected portions of the partial projected glaze portion. Thereby the contact area portions between the heating resistor elements and the recording paper are made uniform and then the difference of the printing density is avoided.

The partial projected glaze portion of the thermal head comprises projected portions having a plurality of stages. The central or upper portion of the heating resistor element is disposed on at least the uppermost stage projected portions of the partial projected glaze portion. Both electrode end portions of the heating resistor element are disposed on two side steep slopes or on the partial projected glaze portion except for above the uppermost stage projected portion. The width of the locally upper projected partial projected glaze portion is set to be about 0.4–0.8 times as long as a pitch of electrodes of the heating resistor element for the electrode direction.

The heating resistor element has a uniform thin film thickness dimension as usual. Moreover the portion of the heating resistor element being contacted with the recording paper under the recording condition is to be a central or upper narrow lateral width portion of the heating resistor element. Then the lengthening of the recording dot can be corrected.

In the printing operation, the portion for directly contributing to the thermal recording is to be the contact portion with which the heating resistor element contacts the recording paper. The lateral dimension of the central or upper portion of the heating resistor element is to small in comparison with the dimension of the heating resistor element. When the effect owing to the movement of the thermal head is added to the above fact, the recording or transfer dot is lengthened toward the lateral direction or printing direction and becomes a properly corrected dot.

DETAILED DESCRIPTION OF THE PREFERRED EMBODIMENTS

Figure 1:
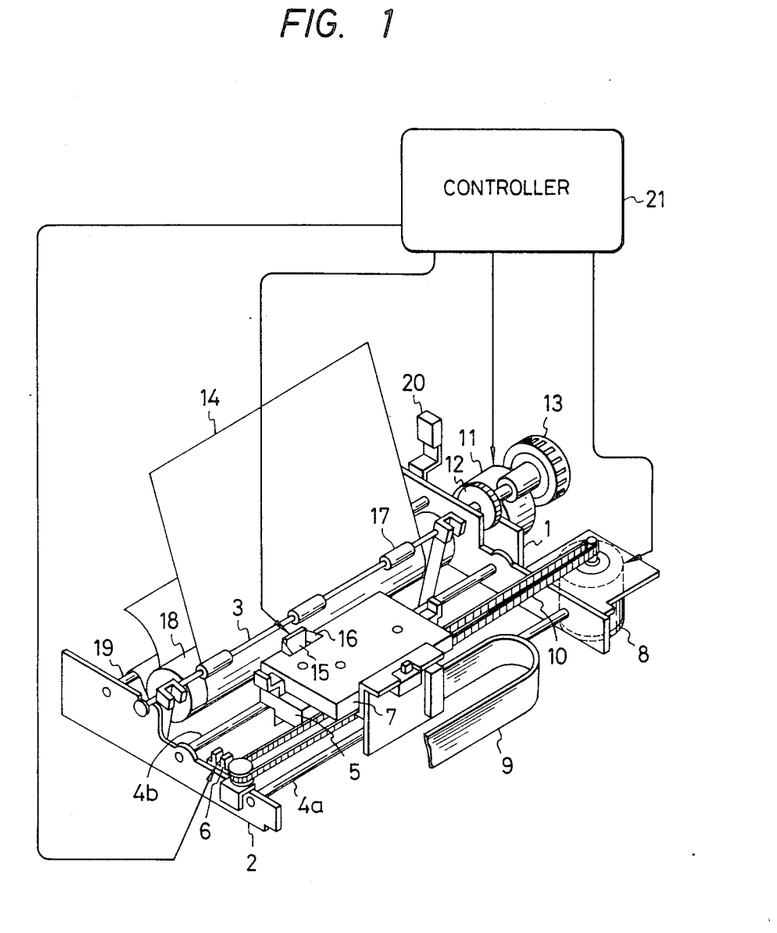
FIG. 1 is an outside appearance view of a thermal transfer printer having a thermal head according to the present invention.

One embodiment of a thermal transfer printer having a thermal head according to the present invention will be described with reference to FIG. 1. FIG. 1 is an outside appearance view of a thermal transfer printer having the thermal head according to the present invention.

A stay 4a and a shaft 4b are fixed between side plates 1 and 2. A carriage 5 is provided slidablely on the shaft 4b and the stay 4a. An ink ribbon cassette 7 and a thermal head 15 are mounted on the carriage 5, and an ink ribbon or a rolled transfer film 16 is housed in the ink ribbon cassette 7. A carriage driving motor 8 is adapted to move the carriage 5 to left and right via a timing belt 10.

A line feed motor 11 is adapted to transmit the driving force to a gear 12, which is connected to the shaft of a paper feed roller, to feed a recording paper 14. The recording paper 14 runs between the paper feed roller and paper holding rollers 17 and into a space between a round platen 18 and the ink ribbon 16 via a platen support member. The recording or transfer paper 14 can also be fed in the same by turning a paper feed roller knob 13 by hand.

A paper guide 19 is adapted to guide the recording paper 14 being wound around the round platen 18. The paper holding rollers 17, which are adapted to press the recording paper 14 against the round platen 18, are mounted slidablely on a shaft 3. A release lever 20 is moved forward and backward to move the shaft 3 toward and away from the platen 18, and thereby presses the recording paper 14 against the round platen 18 or release the recording paper 14 against the round platen 18.

Reference numeral 9 denotes a flat cable for supplying a control signal and the electric power for controlling the generation of heat in the thermal head 15, and reference number 6 denotes a home position sensor. A main circuit controller 21 is adapted to receive a signal from the home position sensor 6 and to control the carriage driving motor 8, the line feed motor 11 and the thermal head 15.

This thermal transfer printer is such a printer of a one-way printing system in which the printing is done only while the carriage 5 is moved to right. Accordingly, the ink ribbon 16 is taken up only while the carriage 5 is moved to right.

Figure 2:
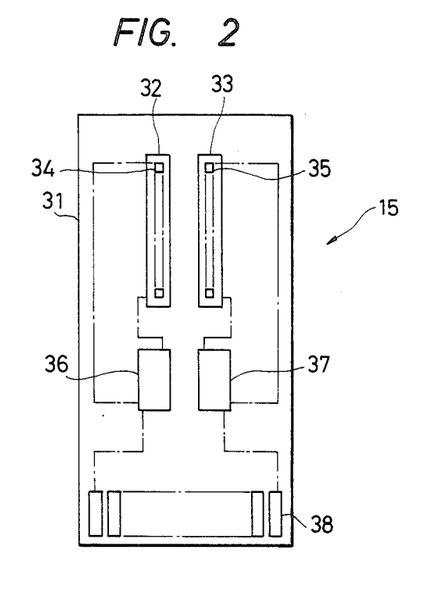
FIG. 2 is a structural view of the thermal head according to the present invention.
Figure 3:
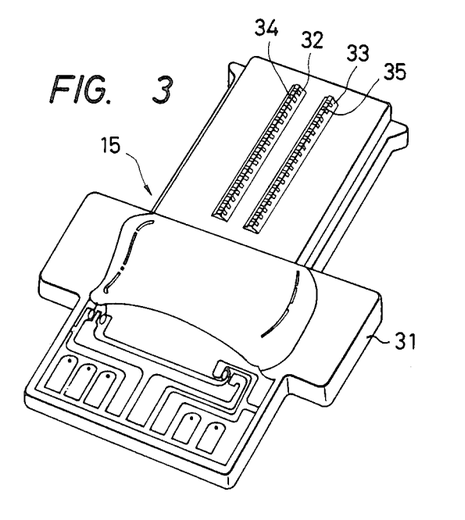
FIG. 3 is a perspective view of the thermal head according to the present invention.

FIG. 2 shows a total structural view of the thermal head. The thermal head 15 comprises a head substrate member or ceramic substrate member 31, two right and left partial projected glaze portions 32 and 33 mounted on the ceramic substrate member 31, and two heating resistor element rows 34 and 35 formed on two partial projected glaze portions 32 and 33, respectively.

The heating resistor element rows 34 and 35 comprise a plurality of heating resistor elements, respectively. The thermal head 15 has two driver's IC apparatuses 36 and 37, and a contact pin portion 38 mounted the ceramic substrate member 31 respectively, so as to drive individually the plurality of heating resistor elements. The driver's IC apparatuses 36 and 37 may be mounted on the main circuit controller 21.

Figure 4:
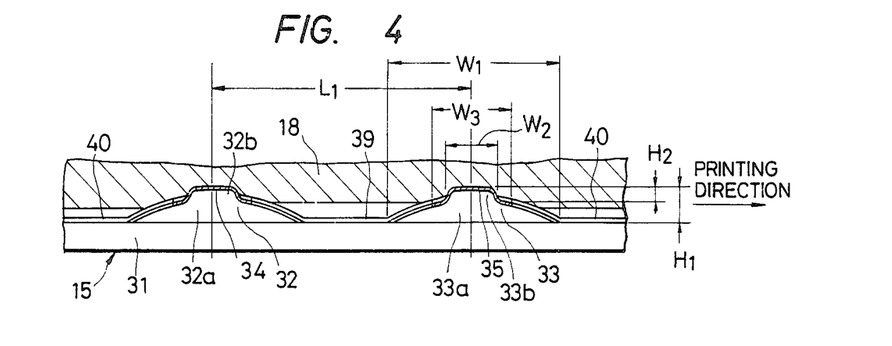
FIGS. 4 and 5 are cross-sectional views between the surrounding portion of the partial projected glaze portion of the thermal head and then platen according to the present invention, respectively.
Figure 5:
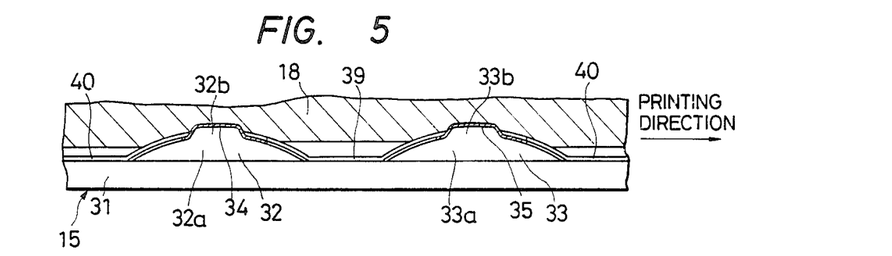

A main sectional structure surrounding the partial projected glaze portions 32 and 33 is shown in FIGS. 4 and 5 when the thermal head 15 presses with the platen 18. For the simplification of explanation, however, protective films of the heating resistor element rows 34 and 35, the ink ribbon 16 in which the protective films of the heating resistor element rows 34 and 35 lie between the heating element rows 34 and 35 and the platen 18, and the recording paper 14 are omitted in FIGS. 4 and 5, respectively.

In FIGS. 4 and 5, the partial projected glaze portions 32 and 33 are formed on the ceramic substrate member 31. The partial projected glaze portion 32 comprises a projected partial projected glaze portion 32a having a substantially round cross-sectionally shape form at a bottom or lower side and a projected partial projected glaze portion 32b formed integrally on the lower projected partial projected glaze portion 32a at an upper side. The upper projected partial projected glaze portion 32b has a substantially trapezoidally cross-sectional shape form and locally projects upwardly from the lower projected partial projected glaze portion 32a.

The partial projected glaze portion 33 comprises a projected partial projected glaze portion 33a having a substantially round cross-sectional shape form at a bottom or lower side and a projected partial projected glaze portion 33b formed integrally on the lower projected partial projected glaze portion 33a at an upper side. The upper projected partial projected glaze portion 32b has a substantially trapezoidally cross-sectional shape form and locally projects upwardly from the lower projected partial projected glaze portion 33a.

The heating resistor element rows 34 and 35 are formed on the partial projected glaze portions 32 and 33, respectively and comprise a plurality of heating resistor elements, respectively. In the present invention, the heating resistor element rows 34 and 35 are disposed on the locally upper projected partial projected glaze portions 32b and 33b, respectively.

The heating resistor element rows 34 and 35 are connected to a common electrode 39 at one side and an individual control electrode 40 at another side so as to supply an electric current to the heating resistor element rows 34 and 35. Each of heating resistor elements of the heating resistor element rows 34 and 35 comprises an upper or central portion of contributing to printing and two side portions or two side steep slopes for not contributing to printing, respectively.

The interval ($L_1$) represents the distance between the partial projected glaze portions 32 and 33 and is about 2–4 mm in length. The width ($W_1$) represents the width of the partial projected glaze portion 32 or 33 and is about 0.8–1 mm in length. The width ($W_2$) represents the width of the locally upper projected partial projected glaze portion 33b and is about 80–200 μm. The width ($W_3$) represents the width of a pitch of electrodes of the heating resistor element and is about 200–250 μm. The height ($H_1$) represents the height of the heating resistor element row 34 or 35 and is about 30–60 μm in height. The height ($H_2$) represents the height of the locally upper projected partial projected glaze portion 32a or 33b and is about 5–30 μm in height. The width of the locally upper projected partial projected glaze portion 32b or 33b is set to be about 0.4–0.8 times as long as the pitch ($W_3$) of electrodes of the heating resistor element.

When the thermal head 15 is pressed with the platen 18, then the platen 18 deforms locally. In this case, the compressive deformation amount of platen 18 becomes small at the surrounding area portions of the partial projected glaze portions 32 and 33 similarly to in the prior art shown in FIGS. 6 and 7.

In FIG. 4, similarly to in the prior art shown FIG. 6, the center between the locally upper projected partial projected glaze portions 32b and 33b and the center between the adjacent heating resistor element rows 34 and 35 has little offset value. Accordingly the heating resistor element rows 34 and 35 contact with the platen 18 at good condition, respectively. FIG. 5 shows a cross-sectional view in which the heating resistor element rows 34 and 35 are pressed with the platen 18, when the center between the locally upper projected partial projected glaze portions 32b and 33b and the heating resistor element rows 34 and 35 has offset value.

In this embodiment of the present invention, as the heating resistor element rows 34 and 35 are disposed on the locally upper projected partial projected glaze portions 32b and 33b, the partial projected glaze portions 32 and 33 bite fully with the platen 18 and further stable contact area portion and stable contact pressure value can be obtained.

Accordingly, a good printing result having no imbalance utilizing the right and left heating resistor element rows 34 and 35 can be obtained. According to this embodiment of the present invention, as the heating resistor element rows 34 and 35 are locally projected in the locally upper projected partial projected glaze portions 32b and 33b, the printing or recording dot shape and the unbalance in printing density under the plurality of the heating resistor element rows 34 and 35 can be improved widely.

According to the locally projected partial projected glaze portions 32b and 33b having the heating resistor element rows 34 and 35 thereon, the contact portion pressure value between the heating resistor element rows 34 and 35 and the recording paper 14 becomes large, thereby the pressing pressure value of the thermal head 15 can be lower.

Figure 8:
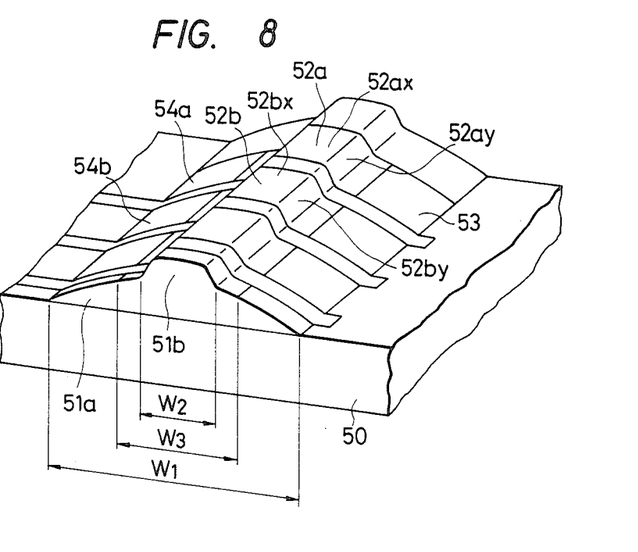
FIG. 8 is a perspective view surrounding the heating resistor element of the thermal head according to the present invention.
Figure 9:
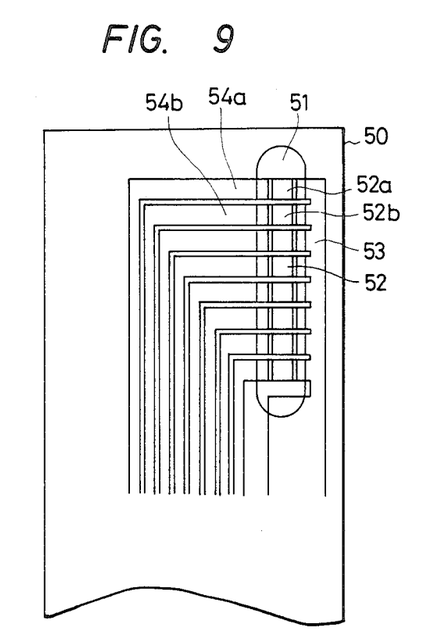
FIG. 9 is an electric pattern view surrounding the heating resistor element of the thermal head according to the present invention.

Another embodiment of the thermal head according to the present invention will be described with reference to FIGS. 8 and 9. In FIGS. 8 and 9 the thermal head comprises a head substrate member or ceramic substrate member 50, a partial projected glaze portion 51 mounted on the ceramic substrate member 50, and a heating resistor element row 52 formed on the partial projected glaze portion 51.

The partial projected glaze portion 51 has a lower projected partial projected glaze portion 51a and a locally upper projected partial projected glaze portion 51b formed integrally with the lower projected partial projected glaze portion 51a. The heating resistor element row 52 comprises a plurality of heating resistor elements 52a, 52b, etc.. Electrodes are drawn with a row of the heating resistor element 52a, 52b, etc. at the right-angled direction or the lateral direction.

The electrodes comprise a common electrode 53 and individual control electrodes 54a, 54b, etc. connected to the heating resistor element 52a, 52b, etc.. The printing movement direction of the thermal head is a direction at right angle to the heating resistor element row 52.

The heating resistor element 52a comprises an upper or central portion 52ax for contributing to printing and two side steep slope portions 52ay for not contributing to printing. The heating resistor element 52b comprises an upper or central portion 52bx for contributing to printing and two side steep slope portions 52by for not contributing to printing.

Although only one partial projected glaze portion 51 is shown, an interval between the adjacent partial projected glaze portions 51 is about 2–4 mm in length. The width ($W_1$) represents the width of the partial projected glaze portion 51 and is about 0.8–1 mm in length. The width ($W_2$) represents the width of the locally upper projected partial projected glaze portion 51b and is about 80–200 μm. The width ($W_3$) represents a pitch of electrodes of the heating resistor element 52 and is about 200–250 μm. The width of the locally upper projected partial projected glaze portion 51b is set to be about 0.4–0.8 times as long as the pitch ($W_3$) of electrodes of the heating resistor element 52.

Figure 10:
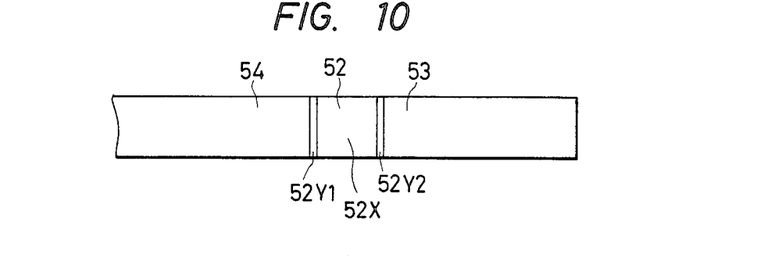
FIG. 10 is a front view surrounding the heating resistor element of the thermal head according to the present invention.
Figure 11:
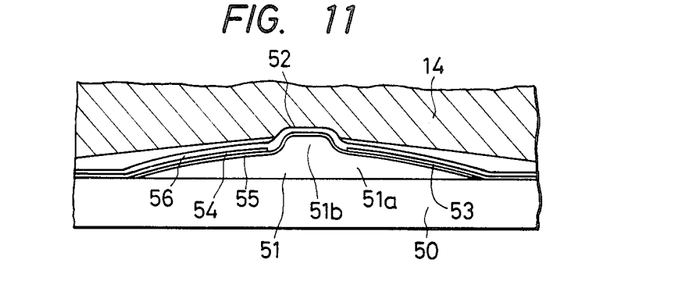
FIG. 11 is a cross-sectional view surrounding the heating resistor element of the thermal head according to the present invention.

FIG. 10 shows a front view of the surrounding portion of the heating resistor element 52 of the thermal head. FIG. 11 shows a cross-sectional view of the thermal head having the heating resistor element 52 and the partial projected glaze portion 51 under the printing condition.

The partial projected glaze portion 51 is processed at form having two stages and has the large projected partial projected glaze portion 51a forming a bottom or lower stage projected portion and the small projected partial projected glaze portion 51b forming an upper stage projected portion. A resistor film 55, a common electrode 53, and an individual electrode 54, and a protective film 56 are coated on the partial projected glaze portion 51 in order.

For the improvement of the contact condition with the recording paper 14, the contact portion 52X with the recording paper 14 except for the side portions 52Y1 and 52Y2 of the heating resistor element 52 which are not rendered serviceable for the printing is made small so that the contact pressure area portion with the heating resistor element 52a, 52b, etc. is concentrated.

In this embodiment of the present invention, both electrode end portions 52Y1 and 52Y2 of the heating resistor element 52 are lengthened toward the common electrode 53 and the individual control electrode 54. Two electrode end portions 52Y1 and 52Y2 of the heating resistor element 52a, 52b, etc. do not contact with the recording paper 14, and the transfer or recording dot becomes narrower toward the electrode direction or printing direction under the stationary printing condition.

Figure 12:
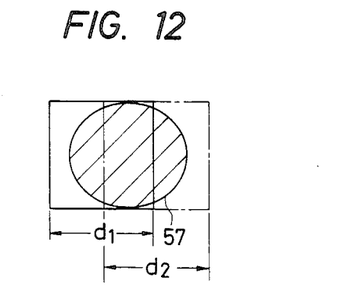
FIG. 12 is a printing recording dot formed by the thermal head according to the present invention.
Figure 13:
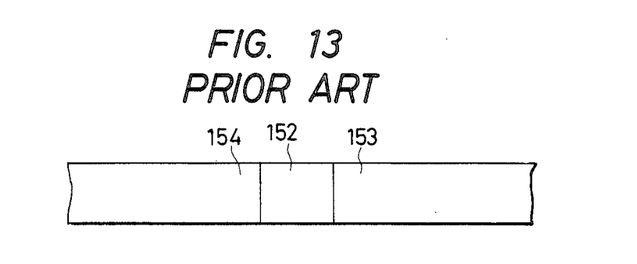
FIG. 13 is a front view surrounding the heating resistor element of the thermal head according to the prior art.

Accordingly, under the normal printing condition the transfer or recording dot becomes longer in the movement direction of the thermal head, and as a result the proper recording dot 57 can be obtained as shown in FIG. 12. In FIG. 12, the length $d_1$ shows the starting condition of the heating resistor element 52 and the length $d_2$ shows the condition of the heating resistor element 52 when one dot continues.

Further, according to this embodiment of the present invention, as the both electrode end portions 52Y1 and 52Y2 of the heating resistor element 52a, 52b, etc. do not contact with the recording paper 14 as shown in FIG. 11, the dislocation portion of the protective film 56 etc. is not easy to receive the mechanical abrasion, therefore the abrasion life of the thermal head becomes longer.

According to this embodiment of the present invention, the contact area portion between the heating resistor element 52a, 52b, etc. and the recording paper 14 has equal dimension to that of the heating resistor element 52a, 52b, etc. at the longitudinal dimension and has a small dimension at the central portion of the heating resistor element 52. Taking account of the lengthening of the recording dot 57 owing to the movement of the thermal head, the recording dot 57 can be obtained properly.

As there is no thermal recording by a little low thermal resistor temperature existing at the both electrode end portions 52Y1 and 52Y2 of the heating resistor element 52a, 52b, etc., the imperfect thermal recording of the outer portion of the recording dot 57 can be prevented therein, and the recording dot 57 becomes sharp.

The bottleneck of the abrasion life in the prior art appears on the both electrode end portions of the heating resistor element with low mechanical strength owing to the strain of the protective film etc. However, in this embodiment of the present invention, the contact area portion between the both electrode end portions 52Y1 and 52Y2 of the heating resistor element 52a, 52b, etc. and the recording paper is reduced and the anti-abrasion characteristics of the thermal head is improved.

We claim:

1. A thin film type thermal head comprising a head substrate member, a partial projected glaze portion mounted on said head substrate member, a plurality of heating resistor elements provided on said partial projected glaze portion, each of said plurality of heating resistor elements having two electrode end portions, each of said plurality of heating resistor elements having a uniform thin thickness, a common electrode provided on said partial projected glaze portion, and an individual control electrode provided on said partial projected glaze portion, said partial projected glaze portion having at least two projected portions of different height, and said plurality of heating resistor elements having a portion thereof disposed on at least the highest projected portion of said partial projected glaze portion with the two electrode end portions of each of said plurality of heating resistor elements being disposed on parts of said partial projected glaze portion other than the highest projected portion thereof.

2. A thin film type thermal head according to claim 1, wherein said at least two projected portions of different height of said partial projected glaze portion include a lower projected portion mounted on said head substrate member and an upper projected portion disposed on said lower projected portion so as to project higher than said lower projected portion.

3. A thin film type thermal head according to claim 2, wherein said upper projected portion is disposed only on a part of said lower projected portion and said upper projected portion has a substantially trapezoidal cross-sectional shape.

4. A thin film type thermal head comprising a head substrate member, a partial projected glaze portion mounted on said substrate member, a plurality of heating resistor elements provided on said partial projected glaze portion, each of said plurality of heating resistor elements having two electrode end portions, each of said plurality of heating resistor elements having a uniform thin thickness, a common electrode provided on said partial projected glaze portion, and an individual control electrode provided on said partial projected glaze portion, said partial projected glaze portion including two projected portions of different height, and said plurality of heating resistor elements being disposed so as to have a portion thereof on a locally upper projected portion of said partial projected glaze portion with the two electrode end portions of each of said plurality of heating resistor elements being disposed on said partial projected glaze portion at parts other than said locally upper projected portion of said partial projected glaze portion, thereby enabling a recording dot to become narrow in a printing direction.

5. A thin film type thermal head according to claim 4, wherein said locally upper projected portion of said partial projected glaze portion has a width of about 0.4–0.8 times as long as a pitch between opposite ends of said two electrode end portions of each of said heating resistor elements in the printing direction.

6. A thin film type thermal head comprising a head substrate member, a partial projected glaze portion mounted on said head substrate member, a plurality of heating resistor elements provided on said partial projected glaze portion, each of said plurality of heating resistor elements having two electrode end portions, each of said plurality of heating resistor elements having a uniform thin thickness, a common electrode provided on said partial projected glaze portion, and an individual control electrode provided on said partial projected glaze portion, said partial projected glaze portion including a bottom stage projected portion and a locally upper stage projected portion, said bottom stage projected portion of said partial projected glaze portion having a substantially round cross-sectional shape, said locally upper stage projected portion of said partial projected glaze portion having a substantially trapezoidal cross-sectional shape, and said plurality of heating resistor elements having portions thereof disposed on said locally upper stage projected portion of said partial projected glaze portion with the two electrode end portions of each of said heating resistor elements being extended in a direction toward said common electrode and said individual control electrode, respectively, a contact area portion between respective ones of said heating resistor elements and a recording paper having an equal dimension to that of said heating resistor element at a longitudinal dimension thereof and having a small dimension at a central portion of said heating resistor element, said two electrode end portions of each of said heating resistor elements being disposed so as to not contact said recording paper, thereby enabling a recording dot to become narrow in a printing direction.

7. A thin film type thermal head according to claim 6, wherein each of said locally upper stage projected portions of said partial projected glaze portion has a width of about 0.4–0.8 times as long as a pitch between opposite ends of said two electrode end portions of each of said heating resistor elements in the printing direction.

* * * * *